United States Patent
Tang et al.

(10) Patent No.: US 12,438,544 B2
(45) Date of Patent: Oct. 7, 2025

(54) LEVEL SHIFTER

(71) Applicant: Vanguard International Semiconductor Corporation, Hsinchu (TW)

(72) Inventors: Po-Yuan Tang, Hsinchu (TW); Yang-Sen Yeh, Baoshan Township (TW); Hsuan-Chi Su, Qionglin Township (TW); Yu-Chuan Chang, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 51 days.

(21) Appl. No.: 18/436,885

(22) Filed: Feb. 8, 2024

(65) Prior Publication Data
US 2025/0260403 A1  Aug. 14, 2025

(51) Int. Cl.
*H03K 19/0185* (2006.01)
(52) U.S. Cl.
CPC .......................... *H03K 19/018521* (2013.01)
(58) Field of Classification Search
None
See application file for complete search history.

(56) References Cited

U.S. PATENT DOCUMENTS

| | | | | |
|---|---|---|---|---|
| 5,243,236 A | * | 9/1993 | McDaniel | H03K 17/102 326/83 |
| 5,834,948 A | * | 11/1998 | Yoshizaki | H03K 19/00315 326/86 |
| 8,502,317 B2 | * | 8/2013 | van den Berg | H03K 3/012 327/333 |
| 11,705,891 B1 | | 7/2023 | Chinthu et al. | |

FOREIGN PATENT DOCUMENTS

| | | |
|---|---|---|
| CN | 110401438 A | 11/2019 |
| TW | I788132 B | 12/2022 |

OTHER PUBLICATIONS

Taiwanese Office Action and Search Report for Taiwanese Application No. 112149911, dated Oct. 15, 2024.

* cited by examiner

*Primary Examiner* — Jeffrey S Zweizig
(74) *Attorney, Agent, or Firm* — Birch, Stewart, Kolasch & Birch, LLP

(57) ABSTRACT

A level shifter receives an input signal through an input terminal and converts the input signal to an output signal. The level shifter includes an input stage circuit and an output stage circuit. The input stage circuit receives the input signal. The input stage circuit includes an N-type transistor that has a gate coupled to the input terminal, a drain coupled to a first node, a source coupled to a ground, and a bulk connected to the source. The output stage circuit is coupled to an output terminal and the first node. The output stage circuit includes a P-type transistor that has a gate, a source coupled to the supply terminal, a drain coupled to the first node, and a bulk disconnected from the source. The output signal is generated at the output terminal. An inverted output signal is generated at the first node.

9 Claims, 5 Drawing Sheets

LEVEL SHIFTER

BACKGROUND OF THE INVENTION

Field of the Invention

The present invention relates to a level shifter.

DESCRIPTION OF THE RELATED ART

In electronic circuits, level shifters are usually configured to convert signals from one power domain to another power domain, thereby allowing integrated circuits with different voltage requirements to be compatible with each other. FIG. 1 shows an example of a level shifter. Referring to FIG. 1, a level shifter 1 comprises N-type metal-oxide-semiconductor (NMOS) transistors 10 and 11, P-type metal-oxide-semiconductor (PMOS) transistors 12 and 13, and an inverter 14. The level shifter 1 receives a supply voltage VPP10, which is, for example, 9 volts (V). When the level shifter 1 receives an input signal IN10 having, for example, a voltage level of 5V, the level shifter 1 converts the input signal IN10 of 5V to an output signal OUT10 having a voltage level of 9V.

During the conversion process, if the respective junction breakdown voltages of PMOS transistors 12 and 13 are lower than the supply voltage VPP10 of 9V, the voltage at the node N10 will be increased to a voltage greater than the voltage of the ground GND10 (for example, 0V), which results in a leakage current flowing from the node N10 to the ground GND10 through the NMOS transistor 10. This leakage current causes unnecessary power consumption. In addition, since the voltage at the node N10 is increased to be greater than 0V, the PMOS transistor 13 is partially turned on rather than fully turned on, which results in a reduction in the supply current flowing through the PMOS transistor 13. Therefore, the voltage level of the output signal OUT10 cannot reach the ideal 9V.

BRIEF SUMMARY OF THE INVENTION

The present invention provides an exemplary embodiment of a level shifter. The level shifter receives an input signal through an input terminal and converts the input signal to an output signal. The level shifter comprises an input stage circuit and an output stage circuit. The input stage circuit is coupled to an output terminal and further coupled to the input terminal to receive an input signal. The input stage circuit receives an inverted input signal. The inverted input signal and the input signal are reverse to each other The input stage circuit comprises a first N-type transistor. The first N-type transistor comprises a gate coupled to the input terminal, a drain coupled to a first node, a source coupled to a ground, and a bulk. The source of the first N-type transistor is connected to the bulk of the first N-type transistor. The output stage circuit is coupled to a power terminal to receive a supply voltage and further coupled to the output terminal and the first node. The output stage circuit comprises a first P-type transistor. The first P-type transistor comprises a gate, a source coupled to the power terminal, a drain coupled to the first node, and a bulk. The source of the first P-type transistor is disconnected from the bulk of the first P-type transistor. The output signal is generated at the output terminal, and an inverted output signal which is reverse to the output signal is generated at the first node.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 2:
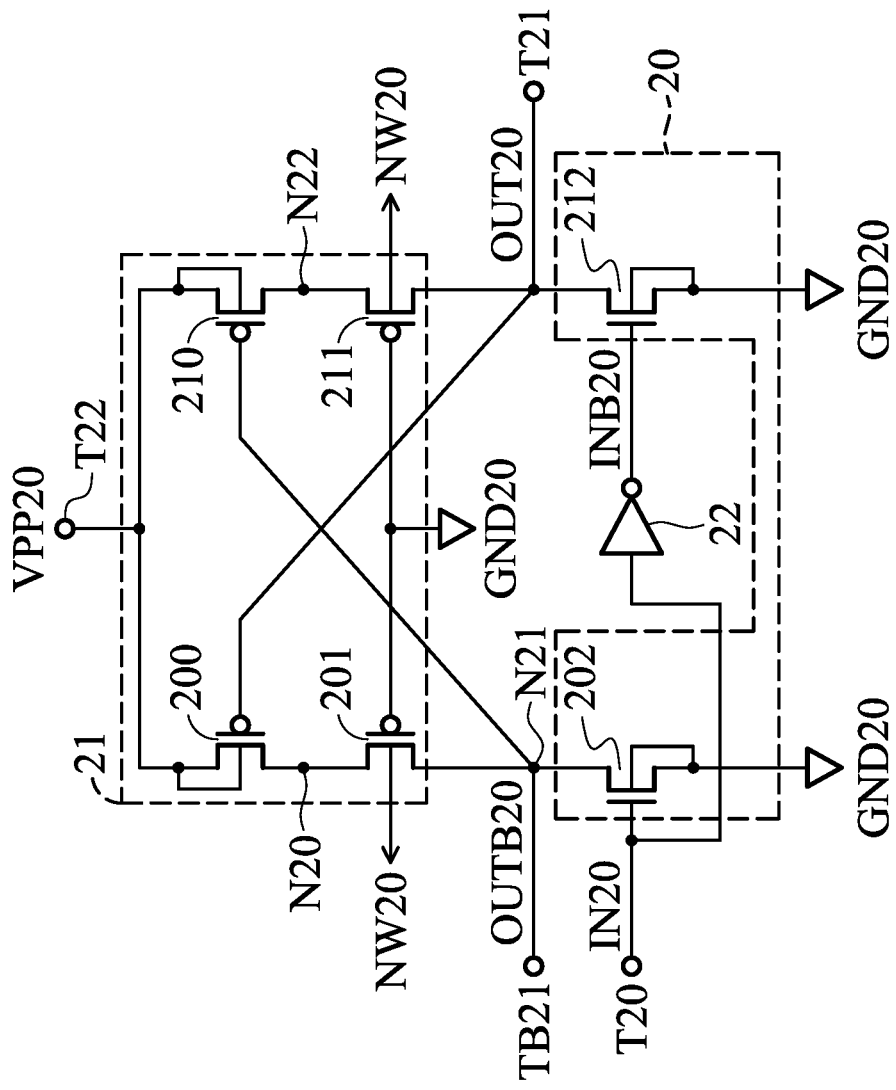
FIG. 2 shows one exemplary embodiment of a level shifter.

FIG. 2 shows one exemplary embodiment of a level shifter. Referring to FIG. 2, a level shifter 2 comprises an input stage circuit 20, an output stage circuit 21, and an inverter 22. The level shifter 2 receives an input signal IN20 through an input terminal T20 and generates another input signal INB20 through the inverter 22 (hereinafter referred to as an inverted input signal INB20). The level shifter 2 converts the input signal IN20 and the inverted input signal INB20 from one power domain to another power domain to generate an output signal OUT20 at an output terminal T21 and an inverted output signal OUTB20 at a reverse output terminal TB21.

As shown in FIG. 2, the input stage circuit 20 comprises N-type transistors 202 and 212. In the embodiment, the N-type transistors 202 and 212 are implemented by N-type metal-oxide-semiconductor (NMOS) transistors.

Referring to FIG. 2, the gate of the NMOS transistor 202 is coupled to the input terminal T20 to receive the input signal IN20, the drain thereof is coupled to a node N21, the source thereof is coupled to a ground GND20, and the bulk thereof is coupled to the ground GND20. Referring to FIG. 2, the node N21 serves as the reverse output terminal TB21. According to the above description, both of the source and the bulk of the NMOS transistor 202 are coupled to the ground GND20. In other words, the source and the bulk of the NMOS transistor 202 are connected to each other. The gate of the NMOS transistor 212 is coupled to the inverter 22 to receive the inverted input signal INB20, the drain thereof is coupled to the output terminal T21, the source thereof is coupled to the ground GND20, and the bulk thereof is coupled to the ground GND20. According to the above description, both of the source and the bulk of the NMOS transistor 212 are coupled to the ground GND20. In other words, the source and the bulk of the NMOS transistor 212 are connected to each other.

The input terminal of the inverter 22 is coupled to the input terminal T20 to receive the input signal IN20. The inverter 22 inverts the input signal IN20 to generate the inverted input signal INB20. The inverted input signal INB20 and the input signal IN20 are reverse to each other (that is, the inverted input signal INB20 is out of phase to the input signal IN20).

As shown in FIG. 2, the output stage circuit 21 comprises P-type transistors 200-201 and 210-211. In the embodiment, the P-type transistors 200-201 and 210-211 are implemented by P-type metal-oxide-semiconductor (PMOS) transistors.

Referring to FIG. 2, the gate of the PMOS transistor 200 is coupled to the output terminal T21, the source thereof is coupled to a power terminal T22, the drain thereof is coupled to a node N20, and the bulk thereof is coupled to the power terminal T22. According to the above description, both of the source and the bulk of the PMOS transistor 200 are coupled to the power terminal T22. In other words, the source and the bulk of the PMOS transistor 200 are connected to each other. The gate of the PMOS transistor 201 is coupled to the ground GND20, the source thereof is coupled to the node N20, and the drain thereof is coupled to the node N21 (that is, the drain of the PMOS transistor 201 is coupled to the reverse output terminal TB21). In the embodiment, the source and the bulk of PMOS transistor 201 are disconnected from each other. The gate of the PMOS transistor 210 is coupled to the node N21, the source thereof is coupled to the power terminal T22, the drain thereof is coupled to a node N22, and the bulk thereof is coupled to the power terminal T22. According to the above description, both of the source and the bulk of the PMOS transistor 210 are coupled to the power terminal T22. In other words, the source and the bulk of the PMOS transistor 210 are connected to each other. The gate of the PMOS transistor 211 is coupled to the ground GND20, the source thereof is coupled to the node N22, and the drain thereof is coupled to the output terminal T21. In the embodiment, the source and the bulk of PMOS transistor 211 are disconnected from each other.

In the embodiment, the bulk of the PMOS transistor 201 and the bulk of the PMOS transistor 211 are electrically connected to the same N-type well region NW20 that is used to form the level shifter 2. According to the above description, both of the gate of the PMOS transistor 201 and the gate of the PMOS transistor 211 are coupled to the ground GND20. Therefore, the PMOS transistors 201 and 211 are always in a turned-on state.

In the embodiment, according to the process specification of the level shifter 2, the junction breakdown voltages of the PMOS transistors 200~201 and 210~211 are approximately equal to 8.2 volts (V).

In the embodiment, the power terminal T22 receives a supply voltage VPP20. The supply voltage VPP20 has different voltages depending on the operation stage of the level shifter 2. For example, when the level shifter 2 operates in a write mode, the level of the supply voltage VPP20 is 9V; when the level shifter 2 operates in a read mode, the level of the supply voltage VPP20 is 2.5V. The level shifter 2 receives the input signal IN20 from a circuit or device that operates in a 5V power domain. In other words, the voltage level of the input signal IN20 switches between the ground voltage (for example, 0V) and 5V.

Figure 1:
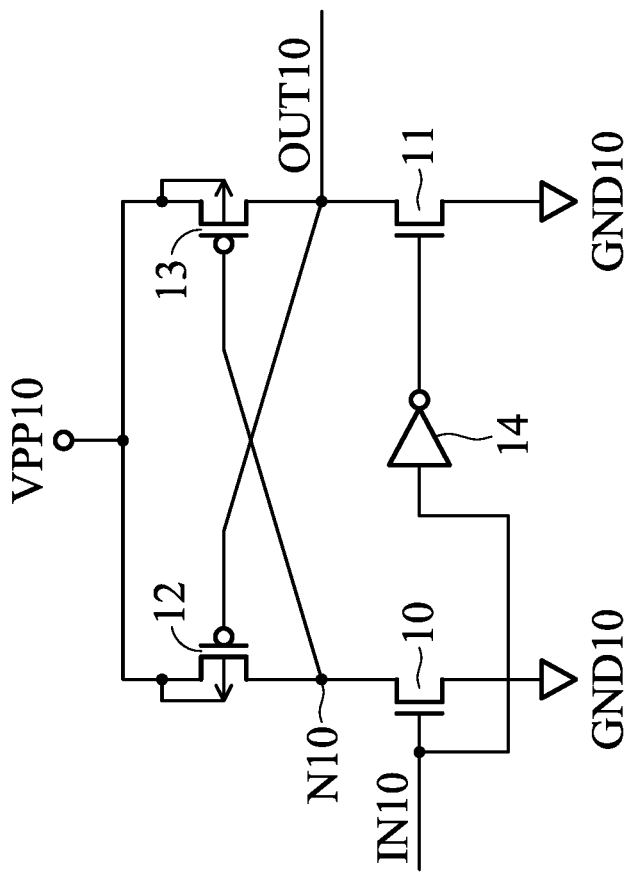
FIG. 1 shows an example of a level shifter.

According to the description about the level shifter 1 shown in FIG. 1, when the supply voltage VPP10 is higher than the respective junction breakdown voltages of the PMOS transistors 12 and 13, unnecessary power consumption may be induced, and the voltage level of the output signal OUT10 is unable to reach the ideal 9V. Therefore, the operation of the level shifter 2 in the case (the write mode) where the level of the supply voltage VPP20 is 9V (larger than the 8.2V junction breakdown voltages of the PMOS transistors 200-201 and 210-211) will be described in detail in the following paragraphs.

Referring to FIG. 2, when the input signal IN20 is at a voltage level of 5V, the NMOS transistor 202 is turned on. The voltage of the node N21 is pulled down to 0V. The voltage of the node N21 serves as the inverted output signal OUTB20 at the reverse output terminal TB21 of the level shifter 2. The inverter 22 inverts the input signal IN20 of 5V to generate the inverted input signal INB20 of 0V. According to the inverted input signal INB20 of 0V, the NMOS transistor 212 is turned off. The PMOS transistor 210 is turned on according to the 0V voltage of the node N21 (that is, according to the 0V voltage level of the inverted output signal OUTB20) so that the voltage of the node N22 is equal to 9V. At this time, the PMOS transistor 211 is turned on according to the 0V voltage of the ground GND20. Based on the turned-on voltage (for example, 0.8V) of the body diode between the source and the bulk of PMOS transistor 211, the bulk of PMOS transistor 211 is biased to 8.2V (9V−0.8V=8.2 V).

Moreover, both of the PMOS transistors 210 and 211 are turned on at this time so that the output signal OUT20 at the output terminal T21 has a voltage level of 9V. In this way, the level shifter 2 converts the input signal IN20 of 5V into the output signal OUT20 of 9V, thereby realizing power domain conversion.

According to the above description, both of the bulk of the PMOS transistor 201 and the bulk of the PMOS transistor 211 are electrically connected to the N-type well region NW20. Therefore, the bulk of the PMOS transistor 201 is also at a voltage of 8.2V. As described above, the junction breakdown voltage of the PMOS transistor 201 is 8.2V. In this case, the voltage of the drain of the PMOS transistor 201 is 0V (8.2V (bulk voltage)−8.2V (junction breakdown voltage)=0V). Since the drain of the PMOS transistor 201 is coupled to the node N21, the voltage of the node N21 can be stably maintained at 0V.

Compared with the level shifter 1 shown in FIG. 1, in the case where the supply voltage VPP20 is greater than the junction breakdown voltages of the PMOS transistors 200~201 and 210~211 (that is, in the write mode), the voltage of the node N21 is not risen and can be stably maintained at 0V. Since the voltage of the node N21 is stably maintained at 0V, there is no leakage current or a very small leakage current between the node N21 and the ground GND20, which reduces unnecessary power consumption. Moreover, the PMOS transistor 210 is fully turned on based on the 0V voltage of the node N21, and the supply current flowing through the PMOS transistors 210 and 211 can be maintained so that the output signal OUT20 can reach the voltage level of 9V.

According to the circuit structure of FIG. 2, the input stage circuit 20 comprises NMOS transistors 202 and 212, and the output stage circuit 21 comprises series-connected PMOS transistors 200-201 and 210-211. In contrast to the level shifter 1 shown in FIG. 1, in order to make the supply current of the level shifter 2 to be the same as the supply current of the level shifter 1, the respective channel impedance of each of the PMOS transistors 200-201 and 210-211 of the output stage circuit 21 needs to be reduced by a half. Therefore, in the embodiment, the respective sizes of the PMOS transistors 200-201 and 210-211 are designed to be twice the respective sizes of the PMOS transistors 12 and 13 of the level shifter 1.

Figure 3:
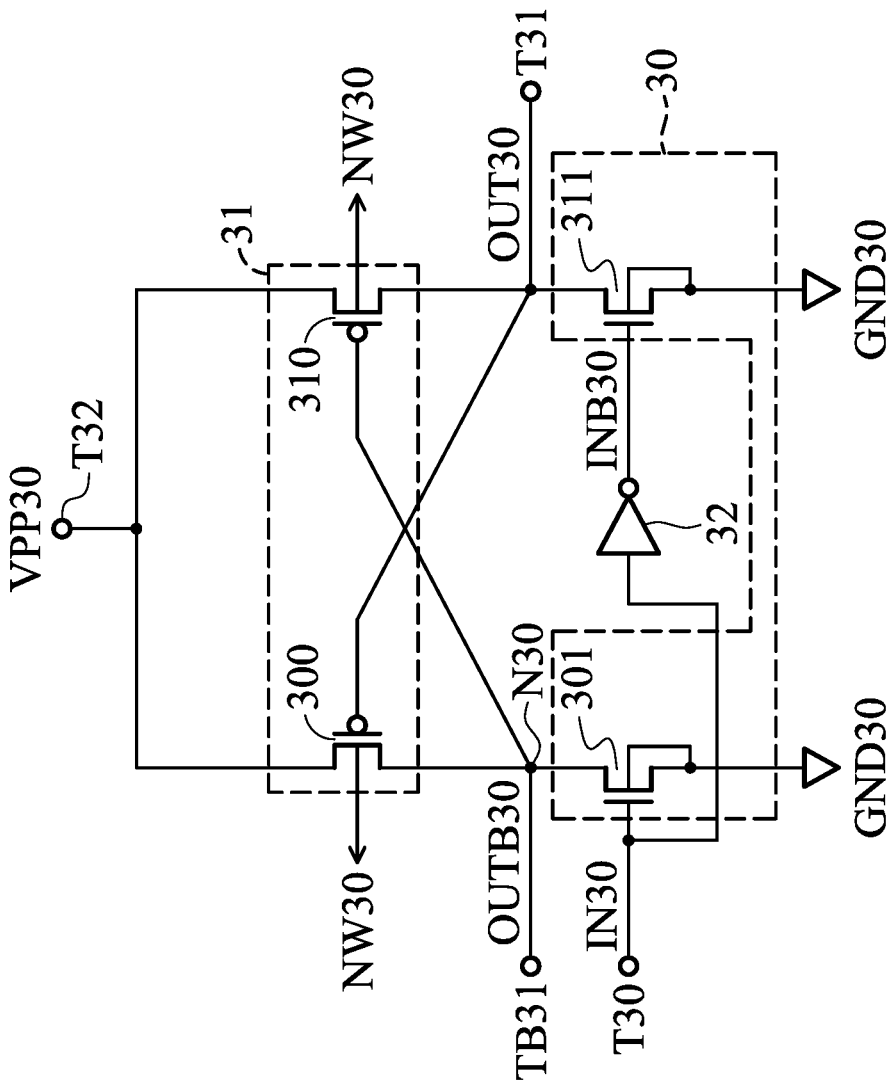
FIG. 3 shows another exemplary embodiment of a level shifter.

FIG. 3 shows another exemplary embodiment of a level shifter. Referring to FIG. 3, a level shifter 3 comprises an input stage circuit 30, an output stage circuit 31, and an inverter 32. The level shifter 3 receives an input signal IN30 through an input terminal T30 and generates another input signal INB30 (hereinafter referred to as an inverted input signal INB30) through the inverter 32. The level shifter 3 converts the input signal IN30 and the inverted input signal INB30 from one power domain to another power domain to generate an output signal OUT30 at an output terminal T31 and an inverted output signal OUTB30 at a reverse output terminal TB31.

As shown in FIG. 3, the input stage circuit 30 comprises N-type transistors 301 and 311. In the embodiment, the N-type transistors 301 and 311 are implemented by NMOS transistors.

Referring to FIG. 3, the gate of the NMOS transistor 301 is coupled to the input terminal T30 to receive the input signal IN30, the drain thereof is coupled to a node N30, the source thereof is coupled to a ground GND30, and the bulk thereof is coupled to the ground GND30. Referring to FIG. 3, the node N30 serves as the reverse output terminal TB31. Based on the above description, both of the source and the bulk of the NMOS transistor 301 are coupled to the ground GND30. In other words, the source and the bulk of the NMOS transistor 301 are connected to each other. The gate of the NMOS transistor 311 is coupled to the inverter 32 to receive the inverted input signal INB30, the drain thereof is coupled to the output terminal T31, the source thereof is coupled to the ground GND30, and the bulk thereof is coupled to the ground GND30. According to the above description, both of the source and the bulk of the NMOS transistor 311 are coupled to the ground GND30. In other words, the source and the bulk of the NMOS transistor 311 are connected to each other.

The input terminal of the inverter 32 is coupled to the input terminal T30 to receive the input signal IN30. The inverter 32 inverts the input signal IN30 to generate the inverted input signal INB30. The inverted input signal INB30 and the input signal IN30 are reverse to each other (that is, the inverted input signal INB30 is out of phase to the input signal IN30).

As shown in FIG. 3, the output stage circuit 31 comprises P-type transistors 300 and 310. In the embodiment, the P-type transistors 300 and 310 are implemented by PMOS transistors.

Referring to FIG. 3, the gate of the PMOS transistor 300 is coupled to the output terminal T31, the source thereof is coupled to a power terminal T32, and the drain thereof is coupled to the node N30 (that is, the drain of the PMOS transistor 300 is coupled to the reverse output terminal TB31). In the embodiment, the source and the bulk of PMOS transistor 300 are disconnected from each other. The gate of the PMOS transistor 310 is coupled to the node N30 (that is, the gate of the PMOS transistor 310 is coupled to the reverse output terminal TB31), the source thereof is coupled to the power terminal T32, and the drain thereof is coupled to the output terminal T31. In the embodiment, the source and the bulk of PMOS transistor 310 are disconnected from each other.

In the embodiment, the bulk of the PMOS transistor 300 and the bulk of the PMOS transistor 310 are electrically connected to the same N-type well region NW30 that is used to form the level shifter 3. Moreover, in the embodiment, according to the process specification of the level shifter 3, the junction breakdown voltages of the PMOS transistors 300 and 310 are approximately 8.2V.

In the embodiment, the power terminal T32 receives a supply voltage VPP30. The supply voltage VPP30 has different voltages depending on the operation state of the level shifter 3. For example, when the level shifter 3 operates in a write mode, the level of the supply voltage VPP30 is 9V; when the level shifter 3 operates in a read mode, the level of the supply voltage VPP30 is 2.5V. The level shifter 3 receives the input signal IN30 from a circuit or device that operates in a 5V power domain. In other words, the voltage level of the input signal IN30 switches between the ground voltage (for example, 0V) and 5V.

According to the description about the level shifter 1 shown in FIG. 1, when the supply voltage VPP10 is higher than the respective junction breakdown voltages of the PMOS transistors 12 and 13, unnecessary power consumption may be induced, and the voltage level of the output signal OUT10 is unable to reach the ideal 9V. Therefore, the operation of the level shifter 3 in the case (the write mode) where the level of the supply voltage VPP30 is 9V (larger than the 8.2V junction breakdown voltages of the PMOS transistors 300 and 310) will be described in detail in the following paragraphs.

Referring to FIG. 3, when the input signal IN30 is at a voltage level of 5V, the NMOS transistor 301 is turned on. The voltage of the node N30 is pulled down to 0V. The voltage of the node N30 serves as the inverted output signal OUTB30 at the reverse output terminal TB31 of the level shifter 3. The inverter 32 inverts the input signal IN30 of 5V to generate the inverted input signal INB30 of 0V. According to the inverted input signal INB30 of 0V, the NMOS transistor 311 is turned off. The PMOS transistor 310 is turned on according to the 0V voltage of the node N30 (that is, according to the 0V voltage level of the inverted output signal OUTB30). Based on the turned-on voltage (for example, 0.8V) of the body diode between the source and the bulk of PMOS transistor 310, the bulk of PMOS transistor 310 is biased to 8.2V (9V–0.8V=8.2 V). Moreover, since the PMOS transistor 310 is turned on, the output signal OUT30 at the output terminal T31 has a voltage level of 9V. In this way, the level shifter 3 converts the input signal IN30 of 5V into the output signal OUT30 of 9V, thereby realizing power domain conversion.

According to the above description, both of the bulk of the PMOS transistor 300 and the bulk of the PMOS transistor 310 are electrically connected to the N-type well region NW30. Therefore, the bulk of PMOS transistor 300 is also at a voltage of 8.2V. As described above, the junction breakdown voltage of PMOS transistor 300 is 8.2V. In this case, the voltage of the drain of the PMOS transistor 300 is 0V (8.2V (bulk voltage)–8.2V (junction breakdown voltage) =0V). Since the drain of the PMOS transistor 300 is coupled to the node N30, the voltage of the node N30 can be stably maintained at 0V.

Compared with the level shifter 1 shown in FIG. 1, in the case where the supply voltage VPP30 is greater than the junction breakdown voltages of the PMOS transistors 300 and 310 (that is, in the write mode), the voltage of the node N30 is not be risen and can be maintained stably at 0V. Since the voltage of the node N30 is stably maintained at 0V, there is no leakage current or a very small leakage current between the node N30 and the ground GND30, which reduces unnecessary power consumption. Moreover, the PMOS transistor 310 is fully turned on based on the 0V voltage of the node N30, and the supply current flowing through the PMOS transistor 310 can be maintained so that the output signal OUT30 can reach the voltage level of 9V.

Moreover, since the voltage of the source of the PMOS transistor 310 is 9V and the voltage of the bulk thereof is 8.2V, a reverse body effect is induced in the PMOS transistor 310. Due to the reverse body effect, the sizes of PMOS transistors 300 and 310 can be designed to be smaller than the sizes of PMOS transistors 12 and 13 shown in FIG. 1. In this case, the supply current flowing through PMOS transistor 310 is still sufficient to cause the output signal OUT30 to reach the voltage level of 9V.

In the embodiment of FIG. 2, when the level shifter 2 operates in the write mode, the level of the supply voltage VPP20 is 9V; when the level shifter 2 operates in the read mode, the level of the supply voltage VPP20 is 2.5V. When the operation mode of the level shifter 2 switches to the read mode from the write mode, the level of the supply voltage VPP20 changes to 2.5V from 9V. However, the bulk of the PMOS transistor 201 and the bulk of the PMOS transistor 211 are both maintained at 8.2V, that is, the N-well region NW20 is also maintained at 8.2V, which may affect the operation speed of the level shifter 2. Therefore, in other embodiments, the level shifter 2 further comprises a discharge circuit for causing the bulk of the PMOS transistor 201 and the bulk of the PMOS transistor 211 (that is, the N-type well region NW20) to start discharging from 8.2V.

Figure 4:
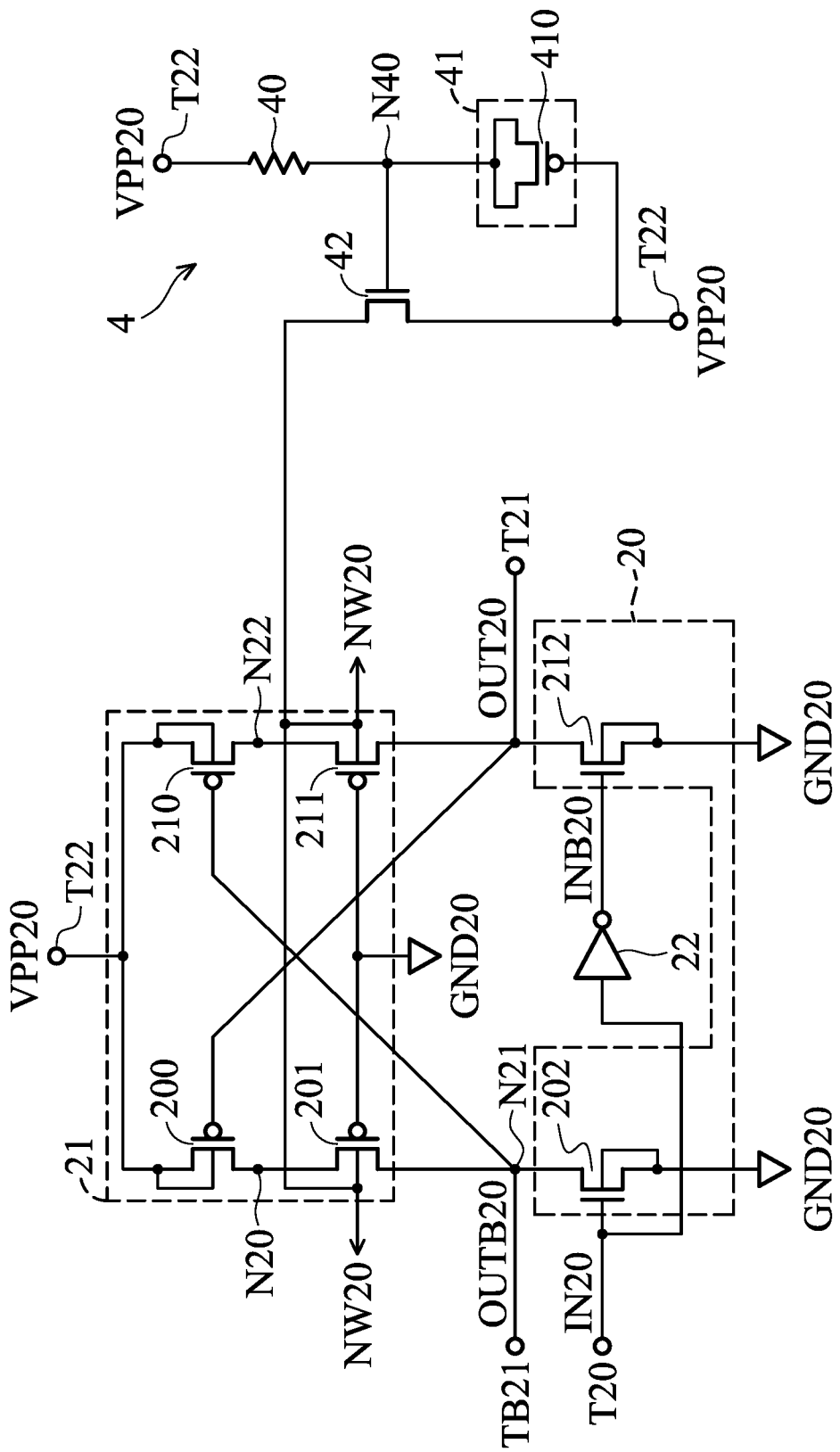
FIG. 4 shows another exemplary embodiment of a level shifter.

Referring to FIG. 4, the level shifter 2 further comprises a discharge circuit 4. The discharge circuit 4 comprises a resistor 40, a capacitor 41, and an N-type transistor 42. A first terminal of the resistor 40 is coupled to the power terminal T22, and a second terminal thereof is coupled to a node N40. The capacitor 41 is coupled between the node N40 and the power terminal T22. The resistor 40 and the capacitor 41 form an RC circuit. In the embodiment, the capacitor 41 is implemented by a PMOS transistor 410. Referring to FIG. 4, the source and the drain of the PMOS transistor 410 are connected to each other, and the gate thereof is coupled to the power terminal T22. The N-type transistor 42 is implemented by an NMOS transistor. The gate of the NMOS transistor 42 is coupled to the node N40, the drain thereof is coupled to the bulk of the PMOS transistor 201 and the bulk of the PMOS transistor 211 (that is, the drain of the NMOS transistor 42 is electrically connected to the N-type well region NW20), and the source thereof is coupled to the power terminal T22.

When the level shifter 2 operates in the write mode, the level of the supply voltage VPP20 is 9V. The supply voltage VPP20 charges the capacitor 41 through the resistor 40 so that the voltage of the node N40 is equal to 9V. At this time, the voltage of each of the gate and the source of the NMOS transistor 42 is 9V so the NMOS transistor 42 is turned off. The bulk of the PMOS transistor 201 and the bulk of the PMOS transistor 211 are maintained at 8.2V (that is, the N-type well region NW20 is maintained at 8.2V).

When the operation mode of the level shifter 2 switches to the read mode from the write mode, the level of the supply voltage VPP20 drops to 2.5V from 9V. Based on the RC circuit composed of the resistor 40 and the capacitor 41, the voltage of the node N40 decreases to 2.5V from 9V. Due to the existence of the capacitor 41, the voltage of the node N40 slowly decreases to 2.5V from 9V. During the period when the level of the supply voltage VPP20 has reached 2.5V and the voltage of the node N40 is slowly decreasing towards 2.5V, the NMOS transistor 42 is turned on, which causes the voltage of the bulk of the PMOS transistor 201 and the voltage of the bulk of the PMOS transistor 211 drop to 2.5V from 8.2V (that is, the voltage of the N-well area NW20 drops to 2.5V from 8.2V). In this way, the discharge operation on the bulk of the PMOS transistor 201 and the bulk of the PMOS transistor 211 (that is, the discharge operation on the N-type well region NW20) is completed.

Figure 5:
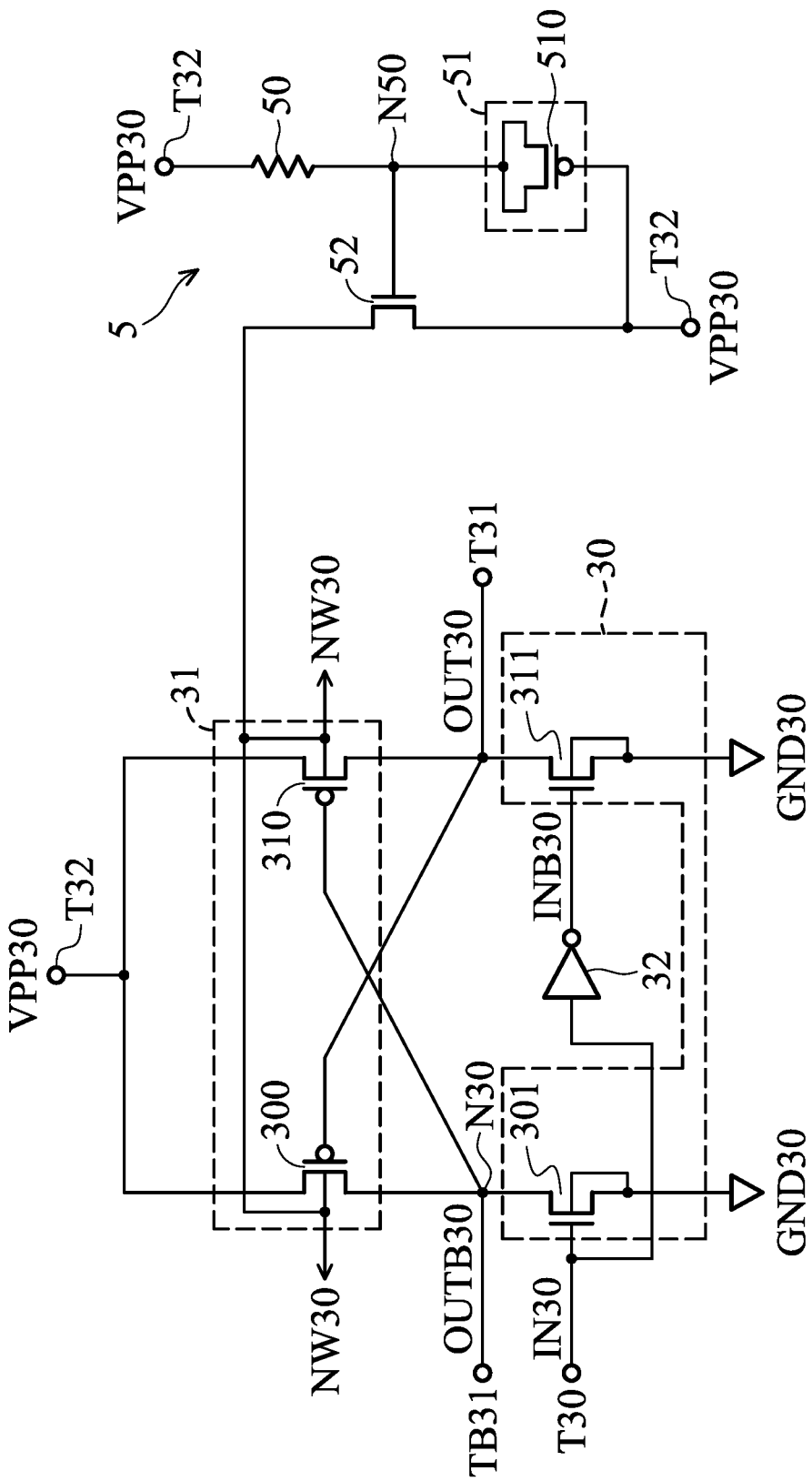
FIG. 5 shows another exemplary embodiment of a level shifter.

Similarly, the level shifter 3 also further comprises a discharge circuit. Referring to FIG. 5, the level shifter 3 further comprises a discharge circuit 5. The discharge circuit 5 comprises a resistor 50, a capacitor 51, and an N-type transistor 52. A first terminal of the resistor 50 is coupled to the power terminal T32, and a second terminal thereof is coupled to a node N50. The capacitor 51 is coupled between the node N50 and the power terminal T32. The resistor 50 and the capacitor 51 form an RC circuit. In the embodiment, the capacitor 51 is implemented by a PMOS transistor 510. Referring to FIG. 5, the source and drain of the PMOS transistor 510 are connected to each other, and the gate thereof is coupled to the power terminal T32. The N-type transistor 52 is implemented by an NMOS transistor. The gate of the NMOS transistor 52 is coupled to the node N50, the drain thereof is coupled to the bulk of the PMOS transistor 300 and the bulk of the PMOS transistor 310 (that is, the drain of the NMOS transistor 52 is electrically connected to the N-type well region NW30), and the source thereof is coupled to the power terminal T32.

The operation of the discharge circuit 5 is the same as the discharge circuit 4 in FIG. 4, and, thus, the related description is omitted here.

Through the operation of the discharge circuit 5, when the operation mode of the level shifter 3 switches to the read mode from the write mode, the bulk of the PMOS transistor 300 and the bulk of the PMOS transistor 310 drop to 2.5V from 8.2V (that is, the N-type well region NW30 drops to 2.5V from 8.2V). In this way, the discharge operation on the bulk of the PMOS transistor 300 and the bulk of the PMOS transistor 310 (that is, the discharge operation on the N-type well region NW30) is completed.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter for receiving an input signal through an input terminal and converting the input signal to an output signal, comprises:

an input stage circuit, coupled to an output terminal and further coupled to the input terminal to receive the input signal, receiving an inverted input signal, wherein the inverted input signal and the input signal are reverse to each other, and the input stage circuit comprises:

a first N-type transistor comprising a gate coupled to the input terminal, a drain coupled to a first node, a source coupled to a ground, and a bulk, wherein the source of the first N-type transistor is connected to the bulk of the first N-type transistor; and an output stage circuit, coupled to a power terminal to receive a supply voltage and further coupled to the output terminal and the first node, wherein the output stage circuit comprises:

a first P-type transistor comprising a gate, a source coupled to the power terminal, a drain coupled to the first node, and a bulk; and a second P-type transistor comprising a gate coupled to the output terminal, a source coupled to the power terminal, a drain coupled to a second node, and a bulk, wherein the source of the first P-type transistor is disconnected from the bulk of the first P-type transistor, wherein the output signal is generated at the output terminal, and an inverted output signal which is reverse to the output signal is generated at the first node, wherein the source of the second P-type transistor is connected to the bulk of the second P-type transistor, and wherein the gate of the first P-type transistor is coupled to the ground, and the source of the first P-type transistor is coupled to the second node.

2. The level shifter as claimed in claim 1, wherein the output stage circuit further comprises:
a third P-type transistor comprising a gate coupled to the first node, a source coupled to the power terminal, a drain coupled to a third node, and a bulk, wherein the source of the third P-type transistor is connected to the bulk of the third P-type transistor; and
a fourth P-type transistor comprising a gate coupled to the ground, a source coupled to the third node, a drain coupled to the output terminal, and a bulk,
wherein the source of the fourth P-type transistor is disconnected from the bulk of the fourth P-type transistor, and
wherein the bulk of the first P-type transistor is connected to the bulk of the fourth P-type transistor.

3. The level shifter as claimed in claim 2, wherein the bulk of the first P-type transistor and the bulk of the fourth P-type transistor are electrically connected to an N-type well region.

4. The level shifter as claimed in claim 2, wherein the input stage circuit further comprises:
a second N-type transistor comprising a gate for receiving the inverted input signal, a drain coupled to the output terminal, a source coupled to the ground, and a bulk,
wherein the source of the second N-type transistor is connected to the bulk of the second N-type transistor.

5. The level shifter as claimed in claim 1, further comprising:
an inverter receiving the input signal and outputting the inverted input signal.

6. A level shifter for receiving an input signal through an input terminal and converting the input signal to an output signal, comprises:
an input stage circuit, coupled to an output terminal and further coupled to the input terminal to receive the input signal, receiving an inverted input signal, wherein the inverted input signal and the input signal are reverse to each other, and the input stage circuit comprises:
a first N-type transistor comprising a gate coupled to the input terminal, a drain coupled to a first node, a source coupled to a ground, and a bulk, wherein the source of the first N-type transistor is connected to the bulk of the first N-type transistor; and
an output stage circuit, coupled to a power terminal to receive a supply voltage and further coupled to the output terminal and the first node, wherein the output stage circuit comprises:
a first P-type transistor comprising a gate, a source coupled to the power terminal, a drain coupled to the first node, and a bulk; and
a second P-type transistor comprising a gate coupled to the first node, a source coupled to the power terminal, a drain coupled to the output terminal, and a bulk,
wherein the source of the first P-type transistor is disconnected from the bulk of the first P-type transistor,
wherein the gate of the first P-type transistor is coupled to the output terminal,
wherein the output signal is generated at the output terminal, and an inverted output signal which is reverse to the output signal is generated at the first node,
wherein the source of the second P-type transistor is disconnected from the bulk of the second P-type transistor, and
wherein the bulk of the first P-type transistor is connected to the bulk of the second P-type transistor, and
wherein the bulk of the first P-type transistor and the bulk of the second P-type transistor are electrically connected to an N-type well region.

7. The level shifter as claimed in claim 6, wherein the input stage circuit further comprises:
a second N-type transistor comprising a gate for receiving the inverted input signal, a drain coupled to the output terminal, a source coupled to the ground, and a bulk,
wherein the source of the second N-type transistor is connected to the bulk of the second N-type transistor.

8. A level shifter for receiving an input signal through an input terminal and converting the input signal to an output signal, comprises:
an input stage circuit, coupled to an output terminal and further coupled to the input terminal to receive the input signal, receiving an inverted input signal, wherein the inverted input signal and the input signal are reverse to each other, and the input stage circuit comprises:
a first N-type transistor comprising a gate coupled to the input terminal, a drain coupled to a first node, a source coupled to a ground, and a bulk, wherein the source of the first N-type transistor is connected to the bulk of the first N-type transistor;
an output stage circuit, coupled to a power terminal to receive a supply voltage and further coupled to the output terminal and the first node, wherein the output stage circuit comprises:
a first P-type transistor comprising a gate, a source coupled to the power terminal, a drain coupled to the first node, and a bulk; and
a discharge circuit coupled to the bulk of the first P-type transistor,
wherein in response to that the supply voltage is at a first voltage level, the bulk of the first P-type transistor is at a second voltage level that is lower than the first voltage level,
wherein the source of the first P-type transistor is disconnected from the bulk of the first P-type transistor,
wherein the output signal is generated at the output terminal, and an inverted output signal which is reverse to the output signal is generated at the first node, and
wherein in response to that the supply voltage changes from the first voltage level to a third voltage level that is lower than the second voltage level, the discharge circuit causes the bulk of the first P-type transistor to be discharged to the third voltage level from the second voltage level.

9. The level shifter as claimed in claim 8, wherein the discharge circuit comprises:
a resistor coupled between the power terminal and a second node;
a capacitor coupled between the second node and the power terminal; and
a second N-type transistor comprising a gate coupled to the second node, a drain coupled to the bulk of the first P-type transistor, and a source coupled to the power terminal.

* * * * *